(12) United States Patent
Lewyn

(10) Patent No.: US 6,373,118 B1
(45) Date of Patent: Apr. 16, 2002

(54) HIGH-VALUE INTEGRATED CIRCUIT RESISTOR

(75) Inventor: Lanny L. Lewyn, Laguna Beach, CA (US)

(73) Assignee: Lewyn Consulting, Inc., Laguna Beach, CA (US)

( * ) Notice: Subject to any disclaimer, the term of this patent is extended or adjusted under 35 U.S.C. 154(b) by 0 days.

(21) Appl. No.: 09/372,546

(22) Filed: Aug. 11, 1999

(51) Int. Cl.$^7$ .............................................. H01L 23/58
(52) U.S. Cl. ........................ 257/488; 257/536; 257/659
(58) Field of Search ................................ 257/536, 537, 257/659, 488

(56) References Cited

U.S. PATENT DOCUMENTS

| | | | | |
|---|---|---|---|---|
| 3,818,413 A | * | 6/1974 | Krimmel | 257/536 |
| 4,454,481 A | | 6/1984 | Lewis | 330/307 |
| 4,707,719 A | | 11/1987 | Whight | 357/53 |
| 4,881,113 A | * | 11/1989 | Momodomi et al. | 357/51 |
| 4,928,199 A | * | 5/1990 | Diaz et al. | 257/356 |
| 5,428,242 A | | 6/1995 | Furuya et al. | 257/538 |
| 6,064,094 A | * | 5/2000 | Intrater et al. | 257/536 |

FOREIGN PATENT DOCUMENTS

| | | | | |
|---|---|---|---|---|
| DE | 41 11 383 A1 | 11/1991 | | H01L/29/74 |
| EP | 0 638 932 A2 | 2/1995 | | H01L/23/64 |

OTHER PUBLICATIONS

Patent Abstracts of Japan, Publication No. JP 01227907, pp. 41–43, Sep. 12, 1989, Inventor: Takayuki (Int. Applicant: Japan Radio Co. Ltd.) Title: Thin Film Resistance Value Detector.

Patent Abstracts of Japan, Publication No. JP 06318597, pp. 607–609, Nov. 15, 1994, Inventor: Takayuki (Int. Applicant: NEC Kyushu Ltd) Title: Semiconductor Device.

* cited by examiner

*Primary Examiner*—Sara Crane
(74) *Attorney, Agent, or Firm*—Jeffrey Slusher

(57) ABSTRACT

In its broadest terms, the invention is an electrostatically shielded and resistively insulated high-value resistor that is implemented using a CMOS resistive sealing layer of a larger CMOS device. In particular, the IC resistor according to the invention uses a substantially continuous, resistive layer to electrically connect the resistor input and output electrodes, which are formed as portions of a top metal layer. The resistive layer itself forms a resistive electrical path between the input and output, isolation of the resistor from other components on the same integrated circuit being provided without patterning of the resistive layer. An output ring portion of the top metal layer is electrically connected to the output electrode and surrounds the input electrode. A grounded shield ring portion of the top metal layer is also preferably included. The shield ring surrounds the output ring portion and forms a first electrostatic shield for the resistor. The input and output electrodes are preferably connected to external circuitry by stacked vias that extend down to a lower metal layer, portions of which form input and output leads to external circuitry. A grounded intermediate metal layer is then preferably also included. This intermediate layer extends between the input connection and the output ring portion to form a second electrostatic shield between the input connection and the output ring portion. The invention also encompasses an integrated circuit (IC) amplifier that has the IC resistor in a feedback path.

7 Claims, 3 Drawing Sheets

HIGH-VALUE INTEGRATED CIRCUIT RESISTOR

BACKGROUND OF THE INVENTION

1. Field of the Invention

This invention relates to solid state metal-oxide-semiconductor MOS integrated circuits and more particularly to an integrated resistor that has a very high resistance value and is thus particularly advantageous for use in a feedback path of an MOS amplifier.

2. Background Art

Resistors commonly used in complementary metal-oxide-semiconductor (CMOS) integrated circuits are constructed using polysilicon above the semiconductor surface or implanted layers below the surface of the silicon. Polysilicon resistors used in modem CMOS circuits are normally constructed as a pattern of squares by depositing a uniform polysilicon layer on the field oxide of the integrated circuit. This layer typically has a resistivity in the range of 20 to 40 Ohms per square in a modern 0.35 $\mu$m process. Most of these processes include some way to block or exclude from the polysilicon resistor surface the silicide that would otherwise reduce the resistivity by an order of magnitude. Another common technique is to add a second polysilicon layer designated for use as a resistive layer with no silicide added. In both of these cases, polysilicon that is not intended to be a part of the resistor circuit is etched away using common lithographic techniques.

It is possible to construct a polysilicon resistor with a value as high as 10,000 Ohms, but then a moderately large amount of circuit area is required. Such a resistor would, for example, have to be constructed from 250 squares of polysilicon of 40 Ohms per square. Because of the large area required, such a resistor may also have a large capacitance to the substrate.

Implanted layers used as resistors are commonly constructed from the N or P implants that are used to construct source, drain or well regions. The well region implant has the highest resistivity—on the order of 1 kOhms per square. Such high-value implanted resistors, because of their intimate contact with the substrate, suffer from the limitations of both high parasitic capacitance to the substrate and high leakage current to the substrate.

Onboard analog CMOS circuits are commonly constructed with filter capacitance elements having values less than a pico-Farad (pF). Larger capacitors are possible, but require larger surface area. A capacitance value of 10 pF, for example, will require 10,000 square microns of circuit area for a typical specific capacitance of 1 femto-Farad (fF) per square micron.

For many years, CMOS analog circuitry has been based on switched-capacitor technology. One reason for this is that switched capacitor filters can be designed using small switched capacitor values in order to implement high-pass filters with band edges in the range of several kHz. To realize a continuous-time filter with a 1 kHz band edge $f_0$ and a 1 pf capacitor C would require a resistor value of $1/(2 \cdot \pi \cdot f_0 \cdot C) =$ 159 mega Ohms. The construction of such large resistor values using 150 squares of resistive material would thus require a resistivity of more than a million Ohms per square. In applications such as active high-pass continuous-time IC filters, the lack of very high resistor values restricts the filter range to very high cut-off frequencies. Moreover, any circuit based on switched-capacitor technology will, almost by definition, add noise and decrease the high-frequency performance of high-speed devices such as analog-to-digital converters and other operational amplifier-based circuits, and will often not be suitable useable in other continuous-time applications at all.

A resistive isolation layer with extremely high resistance is normally applied over the top layer of metal to seal an integrated circuit (IC) against moisture. This resistive isolation layer is typically formed from silicon nitride or silicon oxynitride. The insulation resistance of this layer is typically on the order of tens to hundreds of mega Ohms per square. This layer is, however, a uniform coating that is not shaped or patterned by any lithographic process. Consequently, any portion of the top metal layer contacting the insulating layer may be resistively connected to other top metal structures present on the integrated circuit (IC). Another problem with the resistive layer is that any charge-sensitive circuits formed by top metal connected to the resistive insulating layer may not be electrostatically shielded by covering with any additional metal layers.

One type of CMOS circuit that is particularly sensitive to stray capacitances and other stray charges are charge-sensitive amplifiers, which, by definition, will amplify any such unwanted, stray charges. This problem can be especially detrimental in circuits such as analog-to-digital converters (ADC), in which input and feedback charge control is essential in order to avoid an erroneous binary output.

What is needed is therefore a way to implement a resistive element that has a high resistance value but that does not require such a large circuit area to implement. The implementation should preferably electrostatically shield any charge-sensitive input terminal from the negative effects of various electrostatic fields that typically occur in such integrated circuits. Such a resistive element should also make it possible to implement a CMOS amplifier whose resistive feedback path is much less sensitive to stray charges than is now the case. This invention provides such a resistive element and amplifier implementation.

SUMMARY OF THE INVENTION

In its broadest terms, the invention is a high-value resistive element ("resistor") that may be fabricated using the CMOS resistive isolation layer of a larger CMOS IC. This layer is also used to provide moisture isolation for the IC, especially circuits that are connected to the top metal that is also used in the resistor. The several elements of the resistor according to the invention provide both resistive and electrostatic shielding. This shielding is especially useful for shielding a charge-sensitive input terminal, for example, of an amplifier that includes the resistor. The shielding also reduces capacitive and resistive coupling from electrostatic fields that may arise not only between the resistor's input and output electrodes and connections, but also from both external and internal stray current sources other than those at the output terminal. Such sources include substrate voltages and voltages connected to other metal layers, as well as other circuits fabricated on the same IC as the resistor.

In particular, the invention provides an integrated-circuit resistor that has an input, which includes an input electrode, and an output, which includes an output electrode. A substantially continuous, resistive sealing layer electrically connects the input and output. The resistive layer itself forms a resistive electrical path between the input and output; isolation of the resistor from other components on the same integrated circuit is preferably provided without patterning of the resistive layer. A top metal layer is in contact with the resistive layer; the input and output electrodes are formed as portions of the top metal layer. An output ring portion of the top metal layer is electrically connected to the output electrode and surrounds the input electrode.

In the preferred embodiment, a grounded shield ring portion of the top metal layer is preferably included that surrounds the output ring portion and forms a first conductive and electrostatic shield for the resistor.

A lower metal layer is preferably also included, portions of which form an input connection, which connects the input electrode with an external source, and an output connection, which connects the output electrode with an external circuit. A grounded intermediate metal layer is then preferably also included. This intermediate layer extends between the input connection and the output ring portion and forms a second electrostatic shield between the input connection and the output ring portion.

The invention also encompasses an integrated circuit (IC) amplifier that has the IC resistor in a feedback path.

DETAILED DESCRIPTION

Figure 1A:
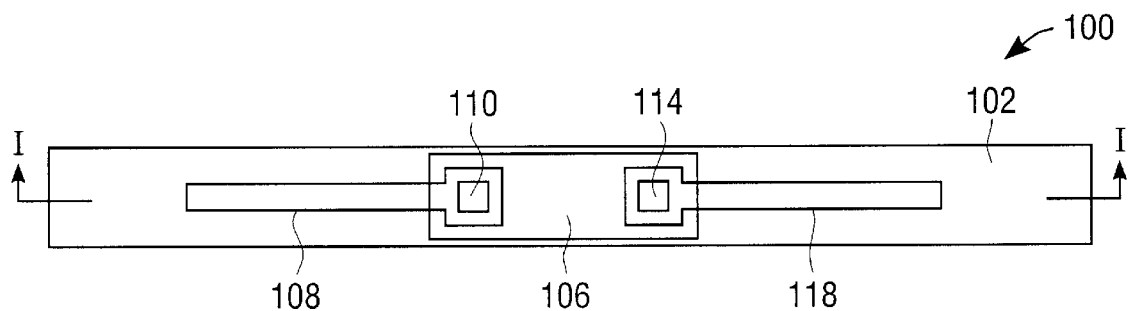
FIG. 1A is a top view of a polysilicon integrated circuit (IC) resistor according to the prior art.
Figure 1B:
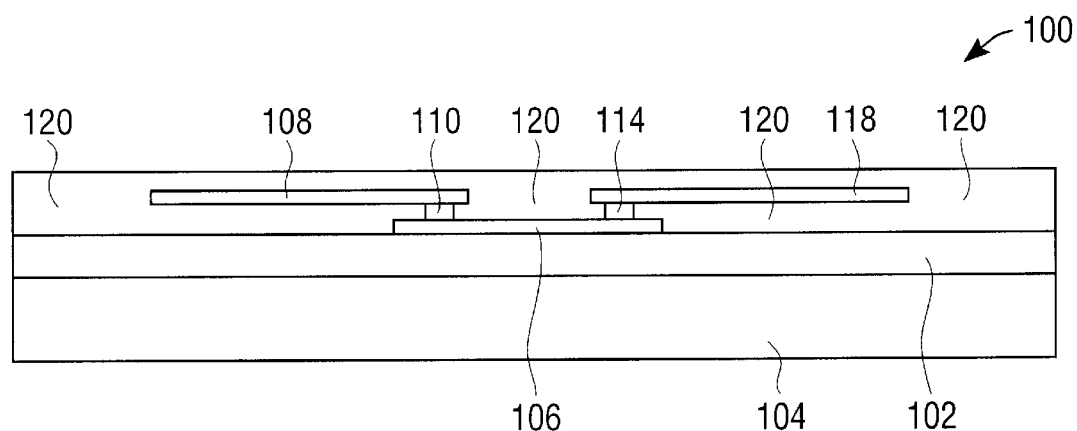
FIG. 1B is a cross-sectional view of the conventional polysilicon integrated circuit (IC) resistor taken along line I—I of FIG. 1A.

In order to better understand the advantages of the invention, it is useful first to understand the construction of a typical integrated circuit polysilicon resistor (or "resistive element") 100 according to the prior art; this is shown in FIGS. 1A and 1B.

As in other CMOS devices, a field oxide layer 102 is deposited on a substrate 104. A polysilicon layer 106 is then uniformly deposited over the field oxide layer 102. The polysilicon layer is then etched away around the resistor in order to electrically isolate the resistor from other elements on the same integrated circuit (IC). The polysilicon layer 106 itself forms the resistive electrical path between the input and output. The patterning of the polysilicon layer defines the resistance value of this prior art resistor. In the illustrated case, the resistor is mainly rectangular. This is generally easiest, but in order to decrease the resistance given a small surface area, such resistors may be patterned as circles, or some other non-rectangular shape.

The electrical path through this conventional resistor 100 proceeds from an external current or voltage source (not shown), that is, the circuitry that supplies the input signal to the resistor, along an input connector 108 to an input terminal 110 (typically formed as a via), to the polysilicon layer 106, across the polysilicon layer 106 to an output terminal 114 (also typically formed as a via) and on to other external circuitry (not shown) via an output connector 118. The connectors 108, 118, and vias 110, 114 are made of any conventional, conductive material such as copper, gold or aluminum, depending on the preferred fabrication process.

In order to provide both structural support and electrical insulation, the regions 120 of the resistor above the field oxide layer 102 that are not taken up by the polysilicon layer or any of the electrically conductive elements of the resistor are typically filled with chemically vapor-deposited (CVD) silicon dioxide glass. In FIG. 1A, this glass is not shown, in order to make the structure of the polysilicon layer 106 more visible.

Figure 2A:
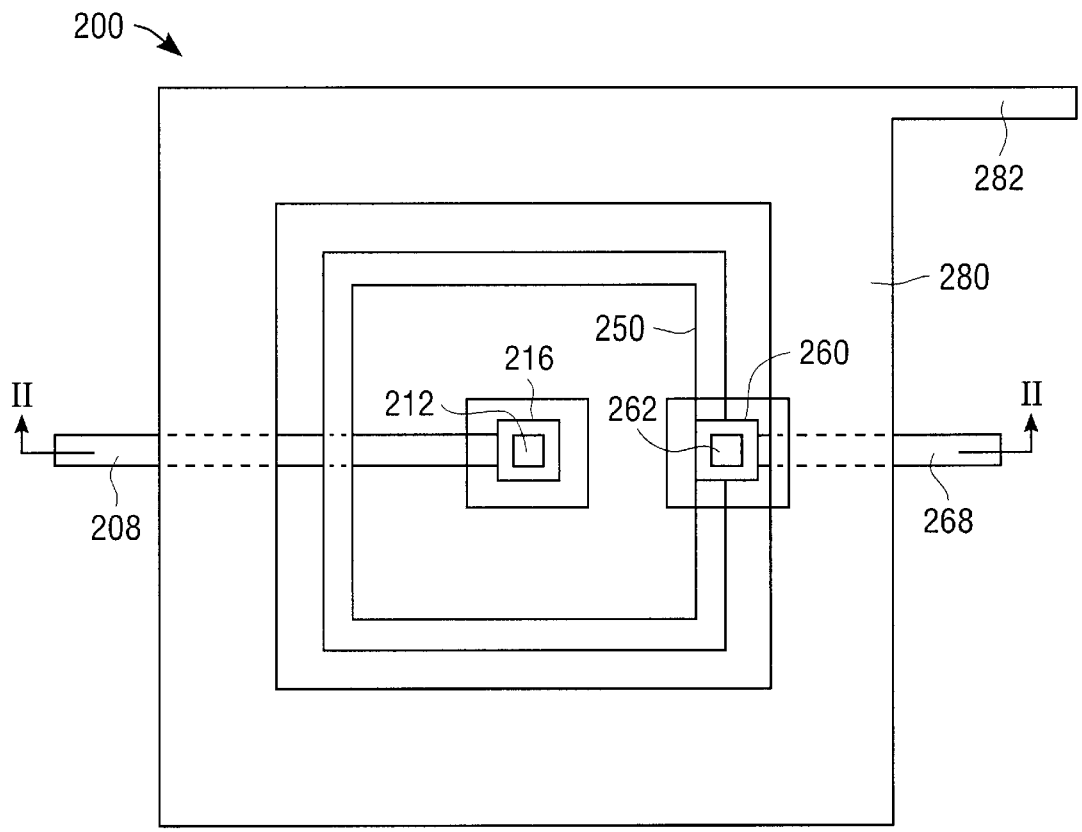
FIG. 2A is a top view of an IC resistor according to the invention with an upper, continuous resistive layer removed to make it possible to see the other features of the invention.
Figure 2B:
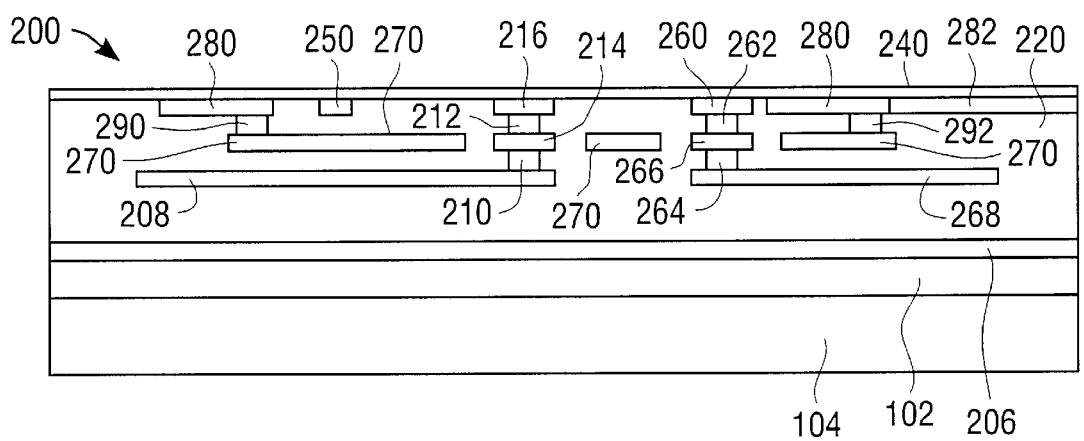
FIG. 2B is a cross-sectional view of the integrated circuit (IC) resistor taken along line II—II of FIG. 2A.

FIGS. 2A and 2B show the high-value, continuous media IC resistor according to the invention. The general structure of the invention is perhaps best understood by first considering the general current path through this resistor. The more specific structures and paths are described below.

Input current enters the resistors along an input connection 208 and upward (viewed as in FIG. 2B) through a set of stacked vias 210, 212, which are separated by a conventional via landing pad 214, and through a metallic input terminal (electrode) 216. The input terminal 216 is in electrical contact with an input region (for example, square) of a continuous resistive sealing layer 240, for example, of deposited silicon nitride or silicon oxynitride. The input region is that portion of the resistive layer immediately adjacent to the metallic input terminal 216. The current then radiates outward from the input region, across the resistive layer 240, to a metallic output ring 250 (for example, for ease of fabrication, a square ring). Current then flows from the output ring 250 down (again viewed as in FIG. 2B) through an output electrode 260 and through a set of stacked output vias 262, 264, which are separated by a conventional via landing pad 266, to an output connector 268 that leads to external circuitry (not shown). The output ring 250 and the output electrode 260 thus together form an output terminal, by means of which input current is led from the resistor.

A grounded shield ring 280 of top metal is preferably in physical and electrical contact with the resistive layer in a closed region that surrounds both the input electrode 216 and output ring 250. The shield ring 280 may include a portion 282 that serves as a ground connection to the IC ground; otherwise, it is connected to the IC ground using some other conventional arrangement. The opening between the shield ring 280 and the output ring 250 is preferably as small as possible, that is, just large enough to pass the isolated-stacked via connection 262, 264, 266 from the lower input metal layer (forming the connection 268) to the top metal output electrode 260.

Now consider the layer structure of the invention, which is illustrated in greater detail in FIG. 2B. As in the conventional resistor 100, the resistor according to the invention is built up over the field oxide layer 102 and the substrate 104.

The preferred embodiment of the invention includes three separate metal layers (a simplified embodiment is described below) that are each either pattern-deposited or etched into portions that form the various electrically conductive elements of the resistor. A lower metal layer is separated into the input and output connections 208, 268. A layer of top metal—the top layer—is similarly separated into the ground shield 280, the output ring 250, the input and output electrodes 216, 260, respectively, and the ground connection portion 282.

A grounded intermediate metal layer 270 is preferably (but optionally) included between the lower and top metal layers. This intermediate metal layer may be connected to circuit ground potential, or any other ground reference potential, either by extending a connection trace from the resistor, or by connecting it through one or more vias 290, 292 to the top metal, grounded shield ring 280. This intermediate metal layer serves to electrostatically isolate the resistor input connection 208 from the output ring 250. The input and output electrodes 216, 260 may then be widely separated to achieve high resistance without exposing the entire length of the lower metal input connecting trace 208 to the electrostatic field from the top metal output ring 250 or other sources of unwanted electrostatic fields.

The intermediate metal layer thus forms at least a partial Faraday shield that reduces capacitive coupling between the resistor input and output, and also helps electrostatically isolate the input from other sources of stray currents. This is especially advantageous when the resistor is used in circuits that are very sensitive to stray charges, such as at the inputs of high input impedance amplifiers. During fabrication, to maximize the shielding effect, the holes formed in the intermediate metal layer through which the stacked input and output via structures extend from the lower to the top metal layers should be made as small as possible.

A grounded polysilicon layer 206 is preferably deposited on the field oxide layer 102, that is, at the bottom of the entire resistor structure. This polysilicon layer, although not necessary according to the invention, is preferably included to electrostatically isolate the resistor input connection 208 and electrode 216 from the substrate 104 and other sources of unwanted electrostatic fields. This wide layer 206 of polysilicon may be connected to circuit ground potential, or any other ground reference potential, in any conventional manner, for example by connecting it through a contact (not shown) to a first metal layer trace or through a series of stacked vias to the top metal wide, grounded shield ring 280 at any convenient point or points.

A layer of silicon overglass (not shown) may be deposited on top of the resistive sealing layer 240. Such application of overglass is conventional and is therefore not described further here.

Note that FIG. 2B is not necessarily to scale. In one prototype of the invention, the substrate 104, field oxide layer 102 and polysilicon layer 206 were about 0.381 mm (15 mils), 0.001 mm (10,000 Å) and 0.0005 mm (5,000 Å) thick, respectively.

In FIG. 2B, every region between the polysilicon layer 206 (or, if this is not included, the field oxide 102) and the upper resistive layer 240 is preferably filled with thermally grown or chemically vapor deposited (CVD) glass 220. This provides both supporting structure and efficient electrical isolation of the conductive or less resistant resistor structures.

The resistive insulator (layer 240) is preferably uniformly deposited above the top metal layer. This resistive layer 240 layer may during IC fabrication be subjected to lithographic processes that form openings along the edge of the IC for the purpose of attaching bond wires to the top metal layer. The resistive layer 240 itself forms the resistive electrical path between the input and output. The resistive layer 240 is, however, preferably wholly or substantially continuous and need not be lithographically patterned in order to define the resistance value or to isolate it from other components on the same IC.

Another advantage of using the substantially continuous (that is, in the region of the resistor), resistive layer 240 is that it forms a barrier to the plastic packaging material of the IC. As is well known, the insulating properties of such packaging material degrade with time, especially after exposure to moisture; this can also lead to unwanted resistive paths, for example, between bonding pads, arising within the IC. The invention is therefore even suitable for use in sensitive applications where moisture or high concentrations of ionic contaminants may occur.

The resistive insulating layer 240 covering the top layer metal is preferably and usually constructed from silicon nitride or silicon oxynitride. Note that the bulk resistance of silicon nitride or silicon oxynitride is typically much lower than that of the silicon dioxide of the insulating glass in the resistor. One advantage of these materials is that they have high resistance per unit area, on the order of more than 10 mega Ohms per square.

The dominant conductive path from the input to output electrodes 216, 260 is therefore through the resistive insulating layer 240 and not through the lower insulating layers of silicon dioxide glass. It is better for the dominant conductive path for the resistor to be this way, that is, from resistor input to output, rather than from input to ground, since this prevents the DC value of the voltage fed back from the output to the input from suffering unacceptably high attenuation, which could result from leakage through the silicon dioxide insulating the lower metal layers from each other, from the polysilicon shield layer 206, from the field oxide layer 102, and from the substrate 104.

The preferred embodiment of the invention thus provides several levels of resistive and electrostatic shielding of the input-output current path from the charges that are often caused by stray fields and parasitic capacitances from other elements in the same IC as the resistor 200, and from unwanted fields and charges that may exist within the resistor itself. The wide, metallic shield ring 280, the intermediate metal layer 270, and the grounded polysilicon layer 206, for example, although not involved directly in creating a resistive path between the input and output, provide effective barriers to unwanted electrostatic and resistive coupling to other elements fabricated on the IC.

Much of this shielding—for example, either the shield ring 280 or the intermediate metal layer 270, or both, (along with the associated vias and connectors)—may, however, be eliminated in applications where a high-value IC resistor is needed but where lower tolerances may be accepted, or where it is known that the problems of parasitic capacitance and induced resistance are only minor. The rest of the invention will still provide a high-value, continuous media IC resistor with a relatively large output ring surrounding a relatively small input terminal.

The dimensions of the resistor may vary and will be chosen depending on the desired resistance and the fabrication process. The minimum distance between the input electrode 216 and the output ring 250 will, for example, depend on what resistance the resistor is to have, since this is the minimum distance the current will have to pass through the resistive layer 240. The thicknesses of the various metallic and non-metallic layers, and the sizes of the vias, for example, may be the same as the standard and well-known sizes used in the art of IC fabrication; they do not have to be of all the same thickness. Moreover, the width of the shield ring 280, which determines the total IC area required for the preferred embodiment of the invention, will often depend on how close the resistor is to be placed relative to other IC circuitry—the wider the shield ring, the more stray charges it is going to capture and lead away.

Furthermore, it is not necessary for the shield ring 280 or the intermediate metal shield layer 270, or even the output ring 250, to have a constant width all around, although this will normally make for easier layout. To give a qualitative idea of the sizes involved, however, one design of the resistor according to the invention had the following dimensions:

Length per side of the square input electrode 216: 1 μm
Length per side of the square output electrode 260: 1 μm
Minimum distance from the input electrode 216 to the output ring 250: 19 μm
Width of the output ring 250: 2 μm
Width of the shield ring 280: 16 μm
Thickness of the resistive layer 240 (silicon nitride): 5,000 Å
Thickness of the top metal layer: 10,000 Å
Thickness of the intermediate metal layer 270: 10,000 Å
Thickness of the bottom metal layer 208,268: 8,000 Å
Resistivity the resistive layer: >10 MOhm/square With these dimensions, the invention provided a resistor with a value in excess of 50 MOhm using an IC surface area of approximately 0.006 mm².

Figure 3:
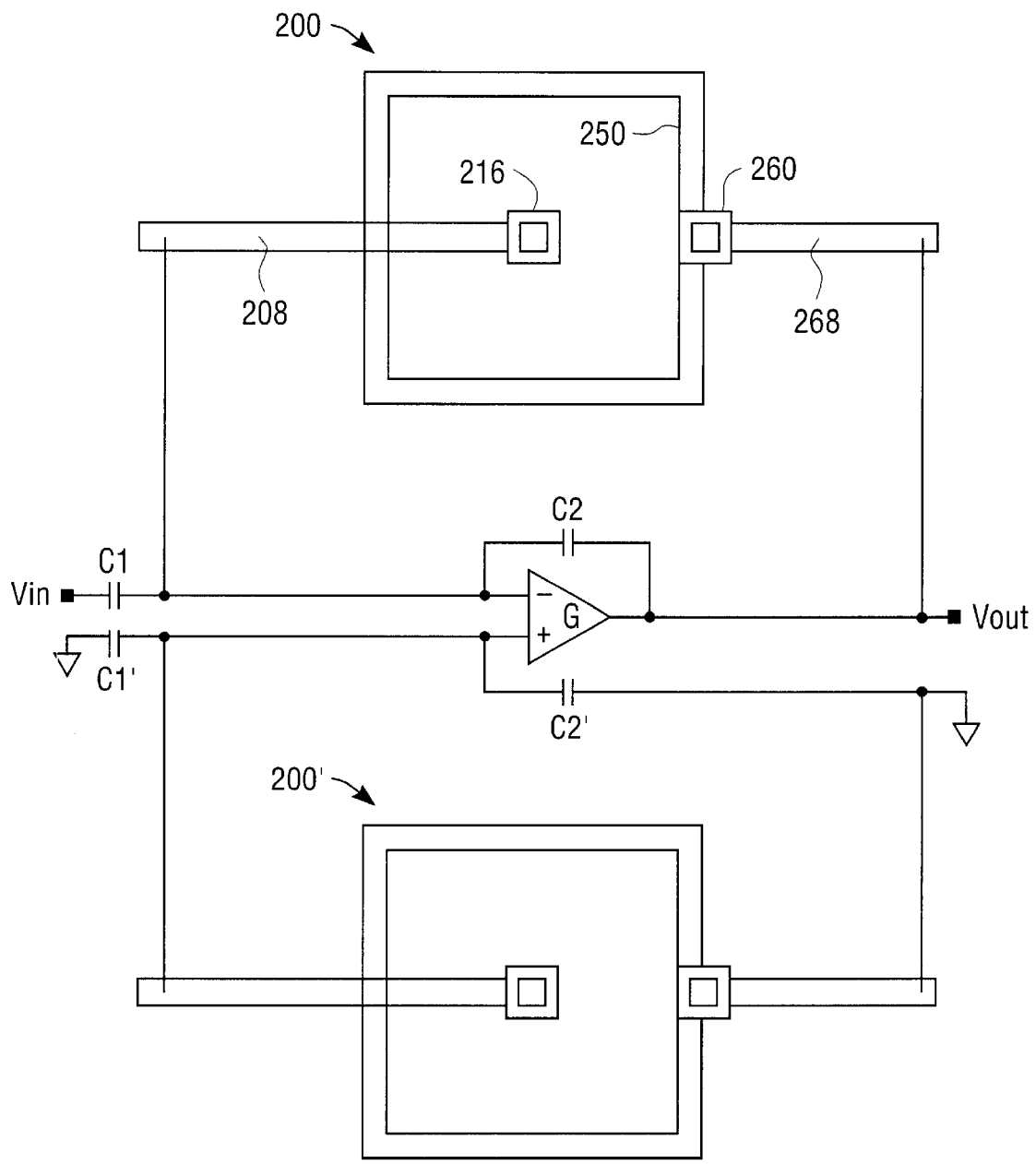
FIG. 3 illustrates a CMOS amplifier with the resistive element of FIGS. 2A and 2B included in a feedback path.

The resistor according to the invention is particularly advantageous when used in a circuit that needs a high-resistance element but has limited IC area available, and especially when the circuit's input is particularly sensitive to stray charges. One such application is in high-pass filters implemented using IC amplifiers, or in other amplifiers such as those used in analog-to-digital converters. FIG. 3 shows the resistor 200 according to the invention used along with such an amplifier. For ease of visualization only, the shield ring 280 and the intermediate layer 270 are not shown in FIG. 3.

The illustrative amplifier shown in FIG. 3 includes a gain element G with an input voltage Vin and an output voltage Vout. A first capacitor C1 is connected between the voltage input Vin and the negative input junction J of the gain element G. The amplifier has a feedback path between the voltage output Vout and the input junction J. A second capacitor C2 and the resistor 200 according to the invention are connected in parallel in the feedback path.

The resistor 200 input connection 208 is typically the CMOS gate input of the gain element. This amplifier input is preferably not connected to any silicon diode junctions; rather, it is preferably connected only to the metal layer that is used for the input connection 208 in all places except for the isolated, stacked vias connecting the input to the top metal layer square forming the resistor input terminal 216, the polysilicon layer forming the control element or gate of the amplifier G input MOS transistor. The resistor output connection 268 may be the output of the gain element G. Because the output is typically a current or voltage output, it is derived from an output terminal, which usually includes a semiconductor junction. This output terminal is preferably connected by a series of isolated, stacked vias to the resistor output, which is formed by the top metal layer output ring 250 surrounding the resistor input terminal 216.

Using common textbook methods, the following relationship can be shown to exist for very high resistance values of the resistor 200.

$$Vout=Vin*(C1/C2)$$

The problem with such textbooks is, however, that they commonly assume ideal conditions; in particular, they ignore the possible unwanted influence of other circuitry fabricated on the same IC as the amplifier. Moreover, they assume that it is even possible to get a sufficiently high resistance value, and this is difficult or impossible in normal IC's without using a very large number of resistive squares. (Note that the invention can provide 10 MOhm resistance with negligible stray capacitance.)

It would be possible, of course, to arrange the resistor according to the invention "backwards," that is, with the input current being applied to the metal ring 250 and the output being taken via the terminal 216. This would not be a good idea in the illustrated application, because the input of the gain element G is typically very charge-sensitive and should therefore be kept as small as possible. The output, on the other hand, is typically voltage-driven and may therefore be larger. The invention provides makes this possible, not only by providing a small input terminal, but also by providing several different structures that protect the input from stray currents and unwanted resistive couplings.

Because the amplifier output terminal is thus a ring surrounding the input terminal, it would be subject to voltages or currents induced in the resistive insulating layer 240 from other circuits with top metal conductors in contact with this resistive layer. The shield ring 280 (FIGS. 2A and 2B) is therefore preferably included to further increase the resistive isolation between the resistor output electrode 260 and other circuits.

It is possible simply to ground the positive input of the gain element. Moreover, in other applications, other circuit components may be included along with the illustrated amplifier circuitry. For use as a precision IC amplifier, however, especially in applications such as analog-to-digital converters, as FIG. 3 illustrates, the capacitors C1, C2 and the resistor 200 are preferably balanced by identical components C1', C2' and 200', respectively, on the across the positive input of the amplifier. This circuit balancing is a known technique, and is used to provide the best common mode rejection and also to help balance out noise that may be induced by parasitic capacitive coupling.

I claim:

1. An integrated-circuit resistor comprising:
an input that includes an input electrode;
an output that includes an output electrode;
a single, unitary, substantially continuous, substantially unpatterned resistive layer electrically connecting the input and output;
a single top metal layer in contact with the resistive layer, the input and output electrodes being formed as portions of the single top metal layer;
a lower metal layer;
an input connection connecting the input electrode with an external source;
an output connection connecting the output electrode with an external circuit;
the input and output connections being formed as portions of the lower metal layer;
in which the output includes an output ring portion of the top metal layer, the output ring portion surrounding the input electrode; and
a grounded intermediate metal layer extending between the input connection and the output ring portion and forming an electrostatic shield between the input connection and the output ring portion.

2. A integrated-circuit resistor comprising:
an input that includes an input electrode;
an output that includes an output electrode;
a substantially continuous, resistive layer electrically connecting the input and output;
a top metal layer in contact with the resistive layer, the input and output electrodes being formed as portions of the top metal layer;
an output ring portion of the top metal layer, the output ring portion being electrically connected to the output electrode and surrounding the input electrode;

a grounded shield ring portion of the top metal layer, the grounded shield ring portion surrounding the output ring portion and forming a first electrostatic shield for the resistor;

a lower metal layer;

an input connection connecting the input electrode with an external source;

an output connection connecting the output electrode with an external circuit;

the input and output connections being formed as portions of the lower metal layer; and a grounded intermediate metal layer extending between the input connection and the output ring portion and forming a second electrostatic shield between the input connection and the output ring portion.

3. A resistor as in claim 2, in which the resistive layer itself forms a resistive electrical path between the input and output, isolation of the resistor from other components on the same integrated circuit being provided without patterning of the resistive layer.

4. An integrated circuit (IC) amplifier comprising:

an amplifier input;

an amplifier output;

a electrical feedback path between the amplifier output and the amplifier input;

an IC resistor connected in the feedback path;

in which:

the IC resistor includes:

an input electrode electrically connected to the amplifier input;

an output electrode electrically connected to the amplifier output;

a substantially continuous resistive layer electrically connecting the input and output electrodes;

a top metal layer in contact with the resistive layer, the input and output electrodes being formed as portions of the top metal layer; and an output ring portion of the top metal layer, the output ring portion surrounding the input electrode.

5. An amplifier as in claim 4, further comprising a grounded shield ring portion of the top metal layer, the grounded shield ring portion surrounding the output ring portion and forming an electrostatic shield for the resistor.

6. An integrated-circuit resistor comprising:

an input that includes an input electrode;

an output that includes an output electrode;

a substantially continuous resistive layer electrically connecting the input and output;

a top metal layer in contact with the resistive layer, the input and output electrodes being formed as portions of the top metal layer; and a grounded shield ring portion of the top metal layer, the grounded shield ring portion directly contacting the resistive layer, surrounding the output, and forming an electrostatic shield for the resistor.

7. An integrated-circuit resistor comprising:

an input that includes an input electrode;

an output that includes an output electrode;

a single, unitary, substantially continuous, substantially unpatterned resistive layer electrically connecting the input and output; and a single top metal layer in contact with the resistive layer, the input and output electrodes being formed as portions of the single top metal layer;

in which the resistive layer itself forms a resistive electrical path between the input and output, isolation of the resistor from other components on the same integrated circuit being provided without patterning of the resistive layer.

\* \* \* \* \*